（12） United States Patent
Yun et al.

(10) Patent No.: US 10,544,266 B2
(45) Date of Patent: Jan. 28, 2020

(54) COMPOSITION FOR THE PRODUCTION OF POLYIMIDE FILM FOR FLEXIBLE BOARD OF PHOTOELECTRONIC DEVICE

(71) Applicant: LG CHEM, LTD., Seoul (KR)

(72) Inventors: Cheolmin Yun, Daejeon (KR); Hye Won Jeong, Daejeon (KR); BoRa Shin, Daejeon (KR); Kyungjun Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 113 days.

(21) Appl. No.: 15/126,416

(22) PCT Filed: Mar. 7, 2016

(86) PCT No.: PCT/KR2016/002263
§ 371 (c)(1),
(2) Date: Sep. 15, 2016

(87) PCT Pub. No.: WO2016/140559
PCT Pub. Date: Sep. 9, 2016

(65) Prior Publication Data
US 2017/0096530 A1 Apr. 6, 2017

(30) Foreign Application Priority Data

Mar. 5, 2015 (KR) .................. 10-2015-0030737
Mar. 7, 2016 (KR) .................. 10-2016-0027035

(51) Int. Cl.
B32B 27/28 (2006.01)
C08G 73/12 (2006.01)
H01L 23/14 (2006.01)
C08J 5/18 (2006.01)
G02F 1/1333 (2006.01)
G02F 1/167 (2019.01)
H01L 31/0392 (2006.01)
H01L 51/00 (2006.01)

(52) U.S. Cl.
CPC .......... *C08G 73/125* (2013.01); *B32B 27/281* (2013.01); *H01L 23/145* (2013.01); *B32B 2457/08* (2013.01); *B32B 2457/20* (2013.01); *C08J 5/18* (2013.01); *C08J 2379/08* (2013.01); *G02F 1/133305* (2013.01); *G02F 1/167* (2013.01); *H01L 31/03926* (2013.01); *H01L 51/0097* (2013.01); *Y10T 428/31721* (2015.04)

(58) Field of Classification Search
CPC ..... B32B 27/281; B32B 27/283; B32B 27/34; C03C 17/30; C08G 73/10; C08G 73/106; C08G 73/12; C08G 73/125; C08G 77/04; C08G 77/455; C08J 2379/08; C08J 5/18; C08K 3/36; C09D 179/08; C09D 183/10; G02F 1/133305; G02F 1/167; G02F 2201/54; H01L 23/145; H01L 31/03926; H01L 51/0096; H01L 51/0097
See application file for complete search history.

(56) References Cited

U.S. PATENT DOCUMENTS

| 4,395,527 | A | * | 7/1983 | Berger ................ C07F 7/0852 257/791 |
| 5,866,250 | A | * | 2/1999 | Oka ...................... C08G 73/10 257/E21.514 |
| 5,959,068 | A | | 9/1999 | Oka et al. |
| 6,468,664 | B1 | | 10/2002 | Park et al. |
| 2005/0065296 | A1 | | 3/2005 | Kozakai et al. |

(Continued)

FOREIGN PATENT DOCUMENTS

CN 102089365 A 6/2011
CN 103168077 A 6/2013
(Continued)

OTHER PUBLICATIONS

Office Action issued in Taiwanese Patent Application No. 105106844 dated Dec. 15, 2016, 6 pages.
(Continued)

*Primary Examiner* — John D Freeman
(74) *Attorney, Agent, or Firm* — Rothwell, Figg, Ernst & Manbeck, P.C.

(57) ABSTRACT

Disclosed is a polyimide precursor composition for the production of a flexible board of a photoelectronic device. The polyimide precursor composition includes a polyimide precursor derived from a diamine or acid dianhydride including a structure of Formula 1:

(1)

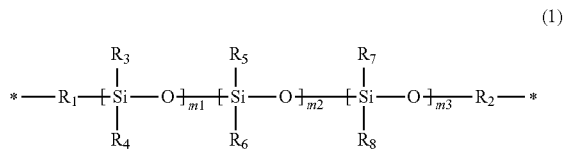

wherein $R_1$ to $R_8$, m1, m2, and m3 are as defined in the specification. Also disclosed is a polyimide film produced from the polyimide precursor composition. The polyimide film is obtained by applying the precursor composition to a substrate and curing the composition. The polyimide film has high transparency and good heat resistance. In addition, the polyimide film exhibits good dimensional stability because the substrate does not undergo an increase in stress even during high-temperature heat treatment.

15 Claims, 1 Drawing Sheet

(56) References Cited

U.S. PATENT DOCUMENTS

| | | | |
|---|---|---|---|
| 2011/0064953 A1* | 3/2011 | O'Rourke | H01L 29/78603 428/414 |
| 2012/0157574 A1* | 6/2012 | Takasaki | C08G 73/106 523/435 |
| 2012/0314294 A1 | 12/2012 | Nakayama | |
| 2013/0237040 A1 | 9/2013 | Kakuta | |

FOREIGN PATENT DOCUMENTS

| EP | 0054426 A2 | 6/1982 |
|---|---|---|
| JP | H06-080782 A | 3/1994 |
| JP | 2006-104447 A | 4/2006 |
| JP | 2008-308618 A | 12/2008 |
| JP | 2009-062429 A | 3/2009 |
| JP | 2010-201625 A | 9/2010 |
| JP | 2011-213853 A | 10/2011 |
| KR | 10-1999-0069076 A | 9/1999 |
| KR | 10-2001-0037632 A | 5/2001 |
| KR | 10-2012-0069382 A | 6/2012 |
| KR | 10-1236256 B1 | 2/2013 |
| WO | 2011-122199 A1 | 10/2011 |
| WO | 2012053548 A1 | 4/2012 |
| WO | 2012-118020 A1 | 9/2012 |
| WO | 2014098235 A1 | 6/2014 |

OTHER PUBLICATIONS

International Search Report and Written Opinion issued for International Application No. PCT/KR2016/002263 dated May 25, 2016, 10 pages.

Office Action issued for Chinese Patent Application No. 201680000859.X dated Mar. 30, 2018, 8 pages.

Office Action issued for Japanese Patent Application No. 2016-551162 dated Jul. 10, 2018, 3 pages.

Extended Search Report issued for European Patent Application No. 16 745 600.3 dated Aug. 31, 2018, 8 pages.

Office Action issued for Chinese Patent Application No. 201680000859.X dated Oct. 17, 2018, 5 pages.

\* cited by examiner

COMPOSITION FOR THE PRODUCTION OF POLYIMIDE FILM FOR FLEXIBLE BOARD OF PHOTOELECTRONIC DEVICE

CROSS-REFERENCE TO RELATED APPLICATIONS

This application is a 35 U.S.C. § 371 National Phase Entry Application from PCT/KR2016/002263, filed on Mar. 7, 2016, and designating the United States, which claims priority under 35 U.S.C. § 119 to Korean Patent Application No. 10-2016-0027035, filed Mar. 7, 2016; and Korean Patent Application No. 10-2015-0030737, filed on Mar. 5, 2015, the entire disclosure of which is incorporated herein by reference.

BACKGROUND OF THE INVENTION

1. Field of the Invention

The present invention relates to a composition for the production of a polyimide film for a flexible board of a photoelectronic device. More specifically, the present invention relates to a composition for the production of a polyimide film that has good dimensional stability without causing a rise in the stress of a substrate despite high-temperature heat treatment.

2. Description of the Related Art

In recent years, lightweight and compact devices have gained importance in display applications. Currently available glass substrates are heavy, tend to be brittle, and are difficult to apply to continuous processes. Under these circumstances, considerable research efforts have been made to replace glass substrates with lightweight flexible plastic substrates that are applicable to continuous processes and to apply such plastic substrates to mobile devices, such as cell phones, notebooks, and PDAs.

Particularly, polyimide (PI) resins are easy to synthesize, can be formed into thin films, and are not required to have cross-linking groups for curing. Due to these advantages, polyimide resins have been actively investigated for use in semiconductor materials, such as LCDs, PDPs, OLEDs, solar cells, and electronic papers, and lightweight flexible plastic display boards with the recent increasing demand for lightweight and high-precision electronic devices.

Polyimide (PI) films refer to films produced using polyimide resins. Polyimide resins are highly heat resistant resins that are typically produced by solution polymerization of an aromatic dianhydride and an aromatic diamine or diisocyanate to prepare a polyamic acid derivative, followed by dehydration ring closure at a high temperature to imidize the polyamic acid derivative.

Boards for flexible displays are produced by coating a polyimide resin solution on a glass substrate and heat treating the coated substrate at a high temperature to form a film. At this time, a difference in coefficient of thermal expansion (CTE) between the underlying glass substrate and the polyimide film layer causes warpage of the glass substrate after formation of the film. This warpage makes it difficult to laminate a device on the film, rendering subsequent processes impossible to carry out.

There is thus a need to develop a composition for the production of a polyimide film that can prevent an underlying substrate from being warped by a difference in CTE from the substrate.

SUMMARY OF THE INVENTION

The present invention is intended to provide a composition for the production of a polyimide film that has high transparency and isotropicity, is highly heat resistant, and can prevent an underlying substrate from being warped by a difference in CTE from the substrate.

The present invention is also intended to provide a highly transparent, isotropic, heat resistant polyimide film that is produced from the polyimide composition.

The present invention is also intended to provide a laminate in which the polyimide film is formed on a substrate and that is less stressed even after high-temperature heat treatment.

The present invention is also intended to provide a photoelectronic device including the polyimide film as a flexible board.

According to one aspect of the present invention, there is provided a polyimide precursor composition for the production of a flexible board of a photoelectronic device, including a polyimide precursor derived from a diamine or acid dianhydride including a structure of Formula 1:

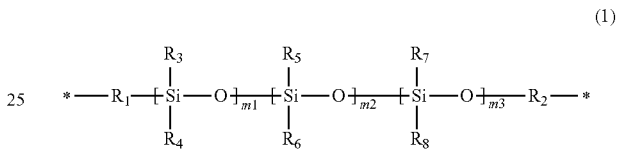

(1)

wherein $R_1$ and $R_2$ are each independently a single bond, a $C_1$-$C_5$ alkylene group or a divalent aromatic group consisting of six or more carbon atoms, $R_3$ and $R_4$ are each independently a $C_1$-$C_5$ alkyl group, $R_5$ and $R_6$ are each independently a $C_4$-$C_{10}$ aryl group, at least one of $R_7$ and $R_8$ is a $C_2$-$C_{10}$ alkenyl group, and m1, m2, and m3 are each independently an integer equal to or greater than 1.

According to one embodiment, the polyimide precursor composition may include 50% by weight or less of the diamine- or acid dianhydride-derived polyimide precursor, based on the total weight of the composition.

According to one embodiment, the diamine- or acid dianhydride-derived polyimide precursor may have a molecular weight of 600 to 7,000.

According to one embodiment, m1, m2, and m3 in Formula 1 may be each independently an integer from 1 to 10.

According to one embodiment, the composition may be a solution of the polyimide precursor in a solvent having a positive partition coefficient.

The solvent may include an amine-based solvent as a first solvent and a non-amine-based solvent as a second solvent.

The amine-based solvent and the non-amine-based solvent may be present in a volume ratio of 50-90:10-50.

According to one embodiment, the amine-based solvent may be a tertiary amine substituted with an alkyl group consisting of two or more carbon atoms.

The non-amine-based solvent may be toluene or tetrahydrofuran.

According to one embodiment, the polyimide precursor composition may further include silica-based particles.

According to a further aspect of the present invention, there is provided a polyimide film for a flexible board of a photoelectronic device that is obtained by applying the composition to a glass substrate and curing the composition.

According to one embodiment, the film may have an average transmittance of at least 80% to light at a wavelength of 350 nm to 760 nm.

According to one embodiment, the polyimide film may have a modulus of 4 GPa or less and a tensile stress of 150 MPa or less.

According to one embodiment, the polyimide film may have a coefficient of thermal expansion (CTE) of 30 ppm to 200 ppm at 100 to 250° C.

According to another aspect of the present invention, there is provided a laminate including a glass substrate and a polyimide film formed on the glass substrate wherein the polyimide film is obtained by applying the composition to the glass substrate and curing the composition.

According to one embodiment, the substrate of the laminate may be stressed at 60 MPa or less after heat treatment at 100 to 350° C.

The present invention also provides a photoelectronic device including the polyimide film as a flexible board.

The present invention also provides a flexible display including the polyimide film as a flexible board.

As described above, the polyimide film of the present invention is obtained by applying the precursor composition to a substrate and curing the precursor composition. The polyimide film of the present invention has high transparency and good heat resistance. In addition, the polyimide film of the present invention exhibits good dimensional stability because the substrate does not undergo an increase in stress even during high-temperature heat treatment. As a result, the polyimide precursor composition of the present invention is suitable for use in the production of a flexible display board in an electronic device, such as an organic light emitting diode (OLED), a liquid crystal display (LCD), an electronic paper or a solar cell.

DETAILED DESCRIPTION OF THE INVENTION

Figure 1:
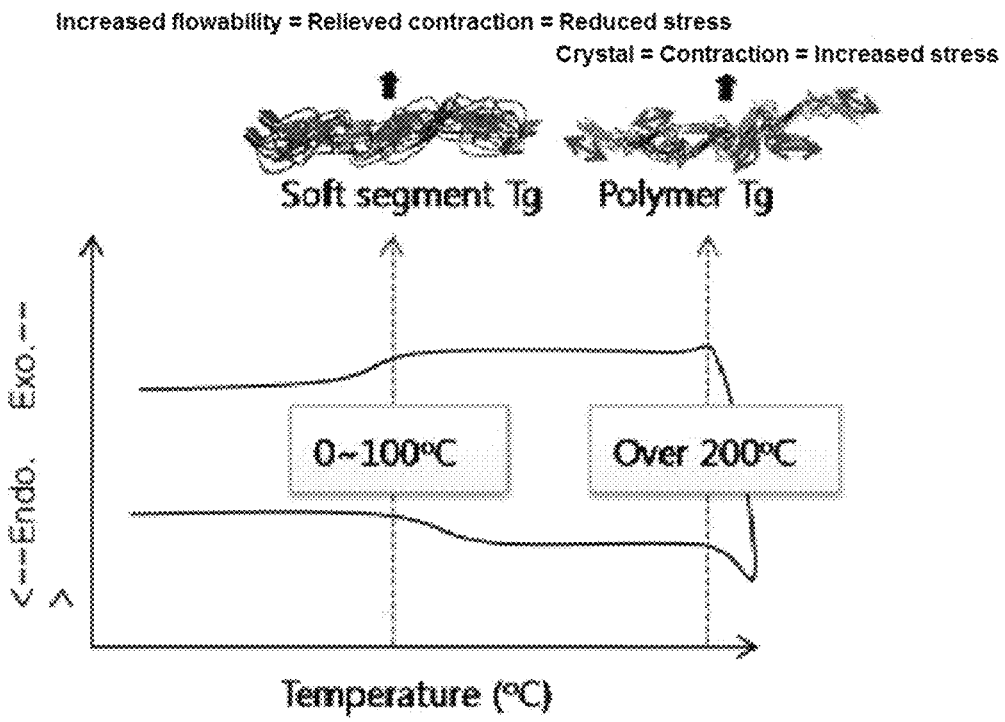
FIG. 1 is a graph explaining the principle of how stress is reduced after high-temperature processing of a polyimide structure according to the present invention.

The term "carbocyclic group" used herein is intended to include not only alicyclic and aromatic cyclic groups but also their heterocyclic groups. The "hetero" means that the functional group includes one to three heteroatoms selected from the group consisting of N, O, S, P, and Si.

As used herein, the term "$C_4$-$C_{20}$ fused polycarbocyclic group" refers to a group in which two or more carbon rings are fused together.

As used herein, the term "$C_6$-$C_{30}$ non-fused polycarbocyclic groups interlinked via a linker" means that two or more carbon rings are linked via a linker. Examples of suitable linkers include a single bond, —O—, —CO—, —S—, —$SO_2$—, —$C(CH_3)_2$—, —$C(CF_3)_2$—, —CONH—, —COO—, —$(CH_2)_{n1}$—, —$O(CH_2)_{n2}O$—, and —OCO$(CH_2)_{n3}OCO$—.

Unless otherwise defined, the term "substituted" means that one or more hydrogen atoms are replaced by substituents selected from the group consisting of halogens, $C_1$-$C_{15}$ haloalkyl groups, a nitro group, a cyano group, $C_1$-$C_{15}$ alkoxy groups, and $C_1$-$C_{10}$ lower alkylamino groups.

The asterisks * shown in the formulae below represent bonding sites.

A detailed description will be given of a polyimide precursor composition for the production of a flexible board of a photoelectronic device according to a specific embodiment of the invention.

The present invention is intended to reduce the stress of a substrate after high-temperature heat treatment. The present inventors have found that when the modulus of elasticity (or Young's modulus or simply modulus) and coefficient of thermal expansion of a polyimide film formed on a substrate are adjusted to 4 GPa or less and 30-200 ppm, respectively, the substrate can be prevented from warpage after high-temperature heat treatment.

One aspect of the present invention provides a composition for the production of a flexible board of a photoelectronic device, including a polyimide precursor derived from a diamine or acid dianhydride including a structure of Formula 1:

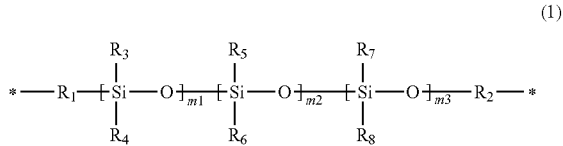

(1)

wherein $R_1$ and $R_2$ are each independently a single bond, a $C_1$-$C_5$ alkylene group or a divalent aromatic group consisting of six or more carbon atoms, $R_3$ and $R_4$ are each independently a $C_1$-$C_5$ alkyl group, $R_5$ and $R_6$ are each independently a $C_4$-$C_{10}$ aryl group, at least one of $R_7$ and $R_8$ is a $C_2$-$C_{10}$ alkenyl group, and m1, m2, and m3 are each independently an integer equal to or greater than 1.

The repeating unit having the structure of Formula 1 includes alkyl-substituted repeating subunits, aryl-substituted siloxane repeating subunits, and alkenyl-substituted siloxane repeating subunits. The presence of these repeating subunits allows a polyimide film produced from the composition to have a modulus of 4 GPa or less and a coefficient of thermal expansion of 30 to 200 ppm.

The alkyl-substituted repeating subunits, the aryl-substituted siloxane repeating subunits, and the alkenyl-substituted siloxane repeating subunits may be arranged in any order. For example, the repeating subunits may be arranged alternately.

According to the present invention, a highly heat resistant elastic polyimide can be provided due to the presence of the alkenyl-substituted repeating subunits. When the polyimide is applied to a display board, the alkenyl-substituted repeating subunits can relieve the stress of a substrate caused by thermal expansion-contraction of the polyimide laminated on the substrate after high-temperature processing, as shown in FIG. 1, and as a result, the substrate can be prevented from being warped by a difference in CTE from the substrate.

According to a preferred embodiment of the present invention, the polyimide precursor composition may include 50% by weight or less of the diamine- or acid dianhydride-derived polyimide precursor, based on the total weight of the composition. A polyimide film produced from the composition according to this embodiment has a modulus of 4 GPa or less and a coefficient of thermal expansion of 30 to 200 ppm. According to an alternative embodiment, the polyimide precursor may be present in an amount of 10% to 40% by weight. According to a further alternative embodiment, the polyimide precursor may be present in an amount of 10% to 30% by weight.

The polyimide precursor composition prepared by mixing with the predetermined proportion of the polyimide precursor having the siloxane repeating subunits substituted with the particular substituents is free from the problems (e.g., poor mechanical and thermal properties) encountered with conventional polyimide precursor compositions including siloxane moieties upon curing at a high temperature of 450° C. or above, achieving high heat resistance even when heat treated at 500° C. or above.

The polyimide precursor may have a molecular weight of 500 to 7,000, preferably 500 to 5,000.

According to one embodiment, $R_1$ and $R_2$ in Formula 1 may be each independently a single bond, a $C_1$-$C_5$ alkylene group or a divalent aromatic group consisting of six or more carbon atoms, preferably an alkylene group consisting of three or more carbon atoms.

$R_3$ and $R_4$ in Formula 1 may be each independently a $C_1$-$C_5$ alkyl group, preferably a methyl or ethyl group $R_5$ and $R_6$ in Formula 1 may be each independently a $C_4$-$C_{10}$ aryl group, preferably a phenyl group.

At least one of $R_7$ and $R_8$ in Formula 1 may be a $C_2$-$C_{10}$ alkenyl group, preferably an ethenyl or propenyl group. Either $R_7$ or $R_8$ may be other than an alkenyl group and may be a $C_1$-$C_5$ alkyl group.

According to one embodiment, m1, m2, and m3 in Formula 1 may be each independently an integer from 1 to 10. Specifically, m1 may be an integer from 3 to 9, m2 may be an integer from 2 to 9, and m3 may be an integer from 1 to 5.

According to one embodiment of the present invention, the polyimide precursor may be prepared from a mixture of a precursor of a polyimide having a structure of Formula 2:

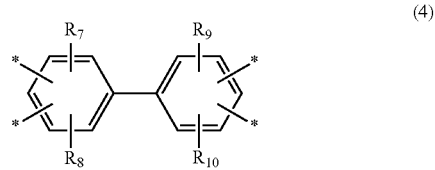

wherein $X_1$ is a tetravalent organic group including an acid dianhydride-derived aromatic, alicyclic or aliphatic group, $Y_1$ is a divalent organic group including a divalent organic group derived from a diamine represented by Formula 1a:

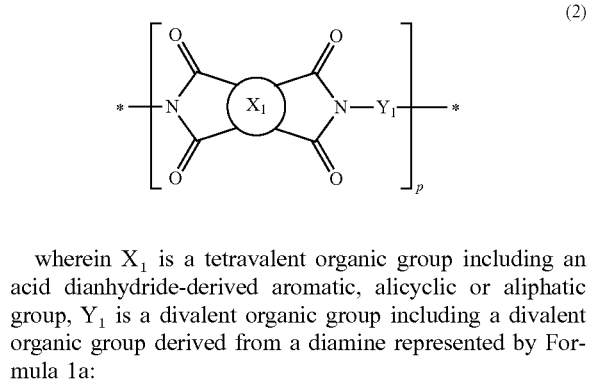

wherein $R_1$ to $R_8$ and m1 to m3 are as defined in Formula 1, and p representing the number of repeating units is an integer equal to or greater than 1, and a precursor of a polyimide having a structure of Formula 3:

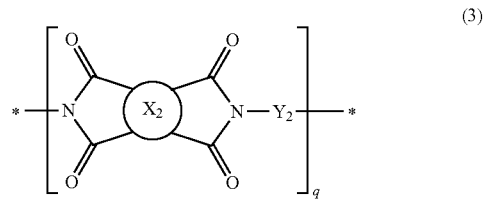

wherein $X_2$ is a tetravalent organic group including an acid dianhydride-derived aromatic, alicyclic or aliphatic group, $Y_2$ is a divalent organic group including a diamine-derived aromatic, alicyclic or aliphatic group, and q representing the number of repeating units is an integer equal to or greater than 1.

According to one embodiment of the present invention, at least one of $Y_1$ and $Y_2$ may be a divalent organic group selected from the group consisting of diamine-derived aromatic, alicyclic, and aliphatic groups and may have a substituent containing one or more fluorine atoms.

Specifically, in Formulae 2 and 3, each of $X_1$ and $X_2$ may include a tetravalent organic group represented by Formula 4:

wherein $R_7$, $R_8$, $R_9$, and $R_{10}$ are each independently selected from a hydrogen atom, halogen atoms, and a hydroxyl group; and each of $Y_1$ and $Y_2$ may include at least one structure selected from divalent organic groups represented by Formulae 5 and 6:

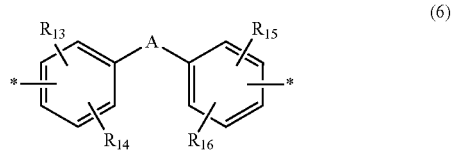

wherein $R_{11}$ and $R_{12}$ are each independently selected from a hydrogen atom, halogen atoms, and a hydroxyl group, and

wherein A is a single bond, —O—, —NH—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O— or —OCO(CH$_2$)$_{n3}$OCO—, n1, n2, and n3 are each independently an integer from 1 to 10, and $R_{13}$, $R_{14}$, $R_{15}$, and $R_{16}$ are each independently selected from a hydrogen atom, halogen atoms, and a hydroxyl group.

In the polyimide structure of Formula 2, the monomer including the siloxane structure of Formula 1 may be present in an amount of 5 mol % to 50 mol %, preferably 5 to 40 mol %. The presence of the monomer in an amount of less than 5 mol % is not effective in preventing warpage of a substrate on which a polyimide film produced from the composition is formed. Meanwhile, the presence of the monomer in an amount exceeding 50 mol % reduces the molecular weight of the polyimide and deteriorates the heat resistance of the polyimide. As a result, heat treatment of the polyimide precursor at a high temperature of 350° C. or above leads to the production of a polyimide film with poor mechanical and thermal properties.

The precursor including the polyimide structure of Formula 2 may further include a monomer having the tetravalent organic group of Formula 4 and a monomer having the divalent organic group of Formula 5 or 6. Each of the monomers may be present in an amount of 10 mol % to 50 mol %, preferably 25 mol % to 50 mol %, more preferably 35 mol % to 50 mol %.

The polyimide structure of Formula 3 may include a monomer having the tetravalent organic group of Formula 4 and a monomer having the divalent organic group of Formula 5 or 6. Each of the monomers may be present in an amount of 5 mol % to 50 mol %, preferably 20 to 50 mol %, more preferably 40 mol % to 50 mol %. Depending on the ratio of the contents of the compounds of Formulae 4 to 6, improvements in the flexibility of the polyimide and the flowability of the polyimide during high-temperature processing can be achieved. The heat resistance of the polyimide molecules during high-temperature processing may also be improved.

According to the present invention, in the polyimide having the repeating structures of Formulae 2 and 3, each of $X_1$ and $X_2$ may further include a tetravalent organic group selected from the group consisting of substituted or unsubstituted $C_4$-$C_{20}$ carbocyclic groups, substituted or unsubstituted $C_4$-$C_{20}$ fused polycarbocyclic groups, and $C_6$-$C_{30}$ non-fused polycarbocyclic groups interlinked via substituted or unsubstituted linkers.

$X_1$ and $X_2$ may be each independently selected from the group consisting of tetravalent organic groups of Formulae 7a to 7d:

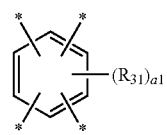

(7a)

wherein $R_{31}$ may be a $C_1$-$C_{10}$ alkyl group (e.g., a methyl, ethyl, propyl, isopropyl, t-butyl, pentyl or hexyl group) or a $C_1$-$C_{10}$ fluoroalkyl group (e.g., a fluoromethyl, perfluoroethyl or trifluoromethyl group) and a1 may be an integer of 0 or 2,

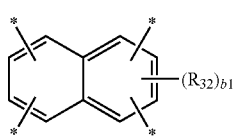

(7b)

wherein $R_{32}$ may be a $C_1$-$C_{10}$ alkyl group (e.g., a methyl, ethyl, propyl, isopropyl, t-butyl, pentyl or hexyl group) or a $C_1$-$C_{10}$ fluoroalkyl group (e.g., a fluoromethyl, perfluoroethyl or trifluoromethyl group) and b1 may be an integer from 0 to 4,

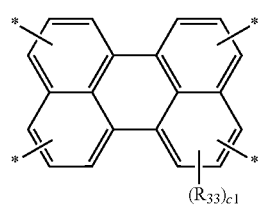

(7c)

wherein $R_{33}$ may be a $C_1$-$C_{10}$ alkyl group (e.g., a methyl, ethyl, propyl, isopropyl, t-butyl, pentyl or hexyl group) or a $C_1$-$C_{10}$ fluoroalkyl group (e.g., a fluoromethyl, perfluoroethyl or trifluoromethyl group) and c1 may be an integer from 0 to 8, and

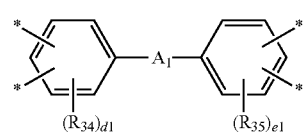

(7d)

wherein $R_{34}$ and $R_{35}$ may be each independently a $C_1$-$C_{10}$ alkyl group (e.g., a methyl, ethyl, propyl, isopropyl, t-butyl, pentyl or hexyl group) or a $C_1$-$C_{10}$ fluoroalkyl group (e.g., a fluoromethyl, perfluoroethyl or trifluoromethyl group), d1 and e1 may be each independently an integer from 0 to 3, and $A_1$ may be selected from the group consisting of a single bond, —O—, —$CR_{46}R_{47}$— (where $R_{46}$ and $R_{47}$ may be each independently selected from the group consisting of a hydrogen atom, $C_1$-$C_{10}$ alkyl groups (e.g., methyl, ethyl, propyl, isopropyl, t-butyl, pentyl, and hexyl groups), and $C_1$-$C_{10}$ fluoroalkyl groups (e.g., fluoromethyl, fluoroethyl, and trifluoromethyl groups), —C(=O)—, —C(=O)NH—, —S—, —SO$_2$—, a phenylene group, and combinations thereof.

Preferably, $X_1$ and $X_2$ are each independently selected from the group consisting of the following tetravalent organic groups:

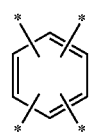

(8a)

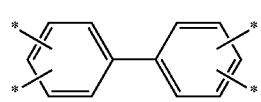

(8b)

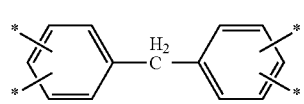

(8c)

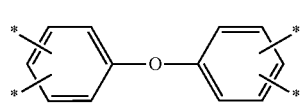

(8d)

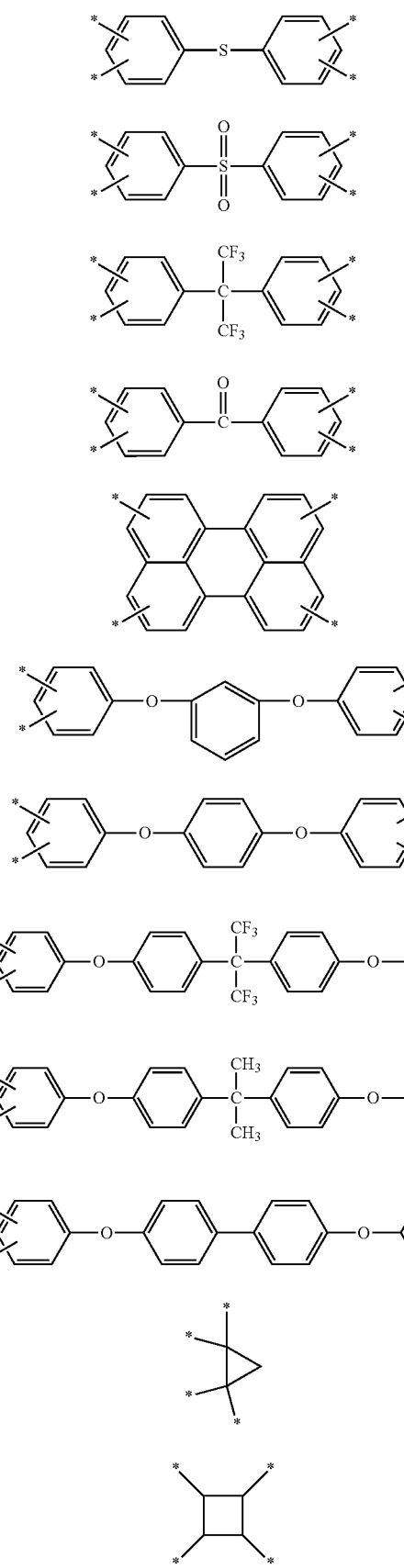

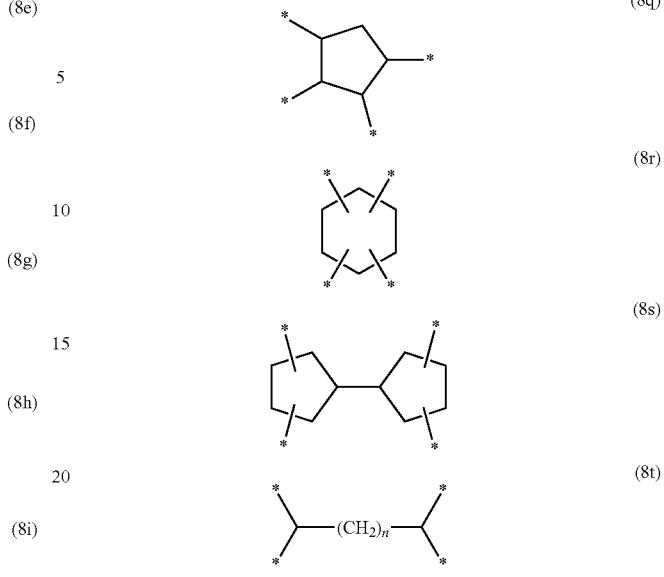

(x is an integer from 1 to 3)

At least one hydrogen atom in each of the aromatic tetravalent organic groups of Formulae 8a to 8n may be optionally replaced by a $C_1$-$C_{10}$ alkyl group (e.g., a methyl, ethyl, propyl, isopropyl, t-butyl, pentyl or hexyl group) or a $C_1$-$C_{10}$ fluoroalkyl group (e.g., a fluoromethyl, perfluoroethyl or trifluoromethyl group).

More specifically, an acid dianhydride from which the tetravalent organic group is derived may be selected from the group consisting of butanetetracarboxylic dianhydride, pentanetetracarboxylic dianhydride, hexanetetracarboxylic dianhydride, cyclopentanetetracarboxylic dianhydride, bicyclopentanetetracarboxylic dianhydride, cyclopropanetetracarboxylic dianhydride, methylcyclohexanetetracarboxylic dianhydride, 3,3',4,4'-benzophenonetetracarboxylic dianhydride, 3,4,9,10-perylenetetracarboxylic dianhydride, 4,4'-sulfonyldiphthalic dianhydride, 3,3',4,4'-biphenyltetracarboxylic dianhydride, 1,2,5,6-naphthalenetetracarboxylic dianhydride, 2,3,6,7-naphthalenetetracarboxylic dianhydride, 1,4,5,8-naphthalenetetracarboxylic dianhydride, 2,3,5,6-pyridinetetracarboxylic dianhydride, m-terphenyl-3,3',4,4'-tetracarboxylic dianhydride, p-terphenyl-3,3',4,4'-tetracarboxylic dianhydride, 4,4'-oxydiphthalicdianhydride, 1,1,1,3,3,3-hexafluoro-2,2-bis[(2,3- or 3,4-dicarboxyphenoxy)phenyl]propane dianhydride, 2,2-bis[4-(2,3- or 3,4-dicarboxyphenoxy)phenyl]propane dianhydride, 1,1,1,3,3,3-hexafluoro-2,2-bis[4-(2,3- or 4-dicarboxyphenoxy)phenyl]propane dianhydride, and mixtures thereof.

According to the present invention, in the structure of the polyimide having the repeating structures of Formulae 2 and 3, each of $Y_1$ and $Y_2$ may further include a divalent organic group selected from the group consisting of substituted or unsubstituted $C_1$-$C_{20}$ alkylene groups, substituted or unsubstituted $C_5$-$C_{40}$ arylene groups, substituted or unsubstituted $C_3$-$C_{40}$ heteroarylene groups, substituted or unsubstituted $C_5$-$C_{40}$ cycloalkylene groups, and substituted or unsubstituted $C_5$-$C_{40}$ heterocycloalkylene groups.

$Y_2$ may be selected from the group consisting of the following divalent organic groups:

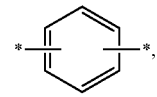 (9a)

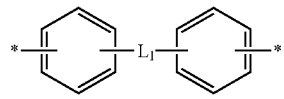 (9b)

wherein $L_1$ is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O— or COO(CH$_2$)$_{n3}$OCO— and n1, n2, and n3 are each independently an integer from 1 to 10,

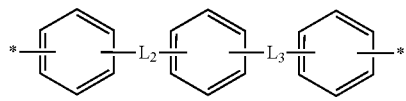 (9c)

wherein $L_2$ and $L_3$, which may be identical to or different from each other, are each independently a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O— or COO(CH$_2$)$_{n3}$OCO— and n$_1$, n$_2$, and n$_3$ are each independently an integer from 1 to 10, and

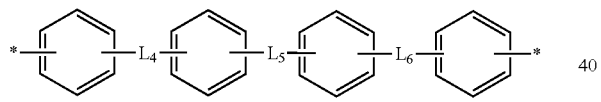 (9d)

wherein $L_4$, $L_5$, and $L_6$, which may be identical to or different from each other, are each independently a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O— or COO(CH$_2$)$_{n3}$OCO— and n1, n2, and n3 are each independently an integer from 1 to 10.

Specifically, $Y_2$ may be selected from the group consisting of the following divalent organic groups:

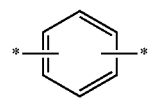 (10a)

 (10b)

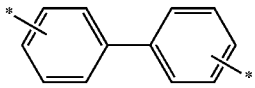 (10c)

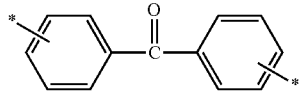 (10d)

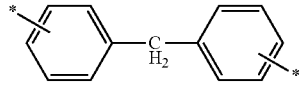 (10e)

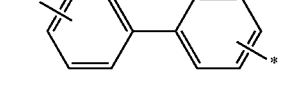 (10f)

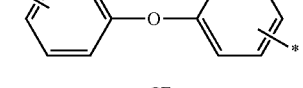 (10g)

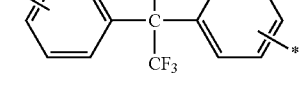 (10h)

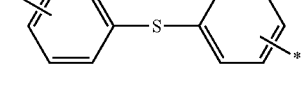 (10i)

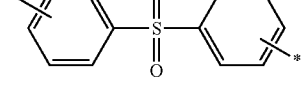 (10j)

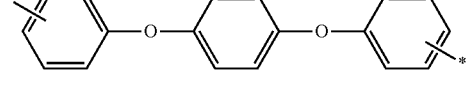 (10k)

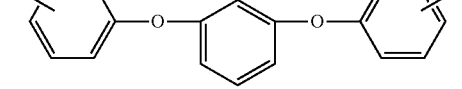 (10l)

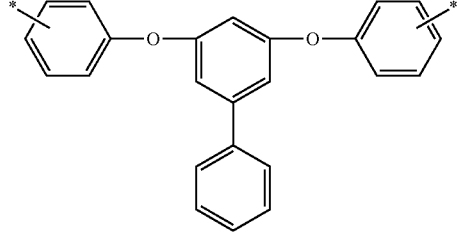 (10m)

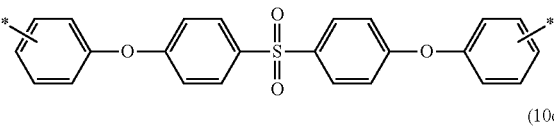 (10n)

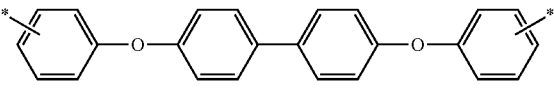 (10o)

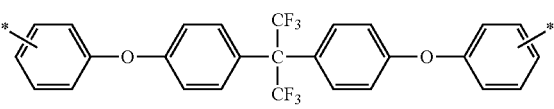 (10p)

-continued

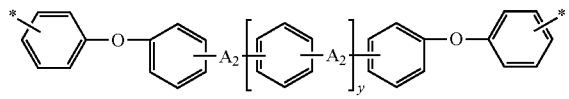
(10q)

In Formula 10q, each $A_2$ may be selected from the group consisting of a single bond, —O—, —C(=O)—, —C(=O)NH—, —S—, —SO$_2$—, a phenylene group, and combinations thereof and v is an integer of 0 or 1.

One or more hydrogen atoms in each of the divalent functional groups of Formulae 10a to 10q may be optionally replaced by substituents selected from the group consisting of $C_1$-$C_{10}$ alkyl groups (e.g., methyl, ethyl, propyl, isopropyl, t-butyl, pentyl, and hexyl groups), $C_1$-$C_{10}$ fluoroalkyl groups (e.g., fluoromethyl, perfluoroethyl, and trifluoromethyl groups), $C_6$-$C_{12}$ aryl groups (e.g., phenyl and naphthalenyl groups), a sulfonic acid group, and a carboxylic acid group.

Specifically, a diamine having the divalent organic group may be selected from the group consisting of 4,4'-diaminodiphenyl ether, 4,4'-diaminodiphenyl sulfide, 4,4'-diaminodiphenylsulfone, 4,4'-diaminobenzophenone, bis[4-(4-aminophenoxy)phenyl]methane, 2,2-bis[4-(4-aminophenoxy)phenyl]propane, 2,2-bis[4-(4-aminophenoxy)phenyl]-1,1,1,3,3,3-hexafluoropropane, 1,3-bis(4-aminophenoxy)benzene, 4,4'-bis(4-aminophenoxy)biphenyl, bis[4-(4-aminophenoxy)phenyl]ketone, bis[4-(4-aminophenoxy)phenyl]sulfoxide, bis[4-(4-aminophenoxy)phenyl]sulfone, bis[4-(4-aminophenoxy)phenyl]ether, 4,4'-bis(4-aminophenylsulfonyl)diphenyl ether, 4,4'-bis(4-aminothiophenoxy)diphenylsulfone, 1,4-bis[4-(4-aminophenoxy)benzoyl]benzene, 3,3'-diaminodiphenyl ether, 3,3-diaminodiphenyl sulfide, 3,3'-diaminodiphenylsulfone, 3,3'-diaminobenzophenone, bis[4-(3-aminophenoxy)-phenyl]methane, 2,2-bis[4-(3-aminophenoxy)phenyl]propane, 2,2-bis[4-(3-aminophenoxy)phenyl-1,1,1,3,3,3-hexafluoropropane, 1,3-bis(3-aminophenoxy)benzene, 4,4'-bis(3-aminophenoxy)biphenyl, bis[4-(3-aminophenoxy)phenyl]ketone, bis[4-(3-aminophenoxy)phenyl]sulfide, bis[4-(3-aminophenoxy)phenyl]sulfone, bis[4-(3-aminophenoxy)phenyl]ether, 4,4'-bis(3-aminophenylsulfonyl)diphenyl ether, 4,4'-bis(3-aminothiophenoxy)diphenylsulfone, 1,4-bis[4-(3-aminophenoxy)benzoyl]benzene, and mixtures thereof.

The polymerization reaction between the acid dianhydride and the diamine may be carried out by any suitable polymerization process known in the art, such as solution polymerization, to prepare a polyamic acid. Specifically, according to solution polymerization, a polyamic acid may be prepared by dissolving the diamine in an organic solvent and adding the acid dianhydride to the resulting solution to react with the diamine. The reaction may be carried out under anhydrous conditions. The polymerization temperature may be from 25 to 50° C., preferably from 40 to 45° C.

According to one embodiment, the composition may be a solution of the polyimide precursor in a solvent having a positive partition coefficient.

The partition coefficient is calculated using an ACD/Log P module of an ACD/Percepta platform available from ACD/Labs (for reference, the ACD/Log P module uses an algorithm based on quantitative structure-property relationship (QSPR) methodology using 2D molecular structures). Preferably, the solvent has a positive partition coefficient (Log P) at 25° C. More specifically, the solvent may have a partition coefficient (Log P) of 0.01 to 3, 0.01 to 2 or 0.01 to 1.

According to a study conducted by the present inventors, when a polyimide or its precursor is dissolved in a hydrophobic solvent having a positive partition coefficient, the dispersibility of the polyimide precursor in the solvent increases, which facilitates the preparation of an amorphous polyimide-based polymer, and as a result, improved adhesiveness of a resulting film can be effectively achieved. In conclusion, the polyimide prepared using the polyimide-based solution has good heat resistance, excellent mechanical properties, and high adhesiveness, which enable the production of a board with improved adhesion of the film to an organic sacrificial layer and a glass substrate.

According to a preferred embodiment of the present invention, the hydrophobic solvent having a positive partition coefficient may be a binary solvent mixture of an amine-based solvent as a first solvent and a non-amine-based solvent as a second solvent. The polyimide precursor of Formula 1 tends to be readily dissolved in the presence of the non-amine-based hydrophobic solvent due to its strong hydrophobicity. The first and second solvents may be present in a volume ratio of 50-90:10-50 in the binary solvent mixture.

The amine-based hydrophobic solvent (first solvent) may be a tertiary amine substituted with an alkyl group consisting of two or more carbon atoms, more preferably a tertiary amine having two or more $C_2$-$C_6$ alkyl groups. More specific examples of suitable amine-based hydrophobic solvents include N,N-diethylacetamide, N,N-diethylformamide, N-ethylpyrrolidone, and mixtures thereof. According to a study conducted by the present inventors, particularly, the use of N,N-diethylformamide was confirmed to improve the transparency of a resulting film.

The non-amine-based hydrophobic solvent (second solvent) may be, for example, toluene or tetrahydrofuran but is not limited thereto.

The content of the organic solvent in the polyimide resin precursor composition may be from 100 to 1000 parts by weight, based on 100 parts by weight of the total solids content of the acid dianhydride and the diamine. If the content of the organic solvent is less than the lower limit defined above, the viscosity of the composition may be excessively high, causing poor coatability of the composition. Meanwhile, if the content of the organic solvent is more than the upper limit defined above, the composition may not be easy to dry and the mechanical properties of a resulting film may deteriorate.

As a result of the polymerization reaction, a polyamic acid as a precursor of the polyimide is prepared. The polyamic acid is an acid or a derivative of the acid including —CO—NH— and CO—OR groups (where R is a hydrogen atom or an alkyl group), which are formed as a result of the reaction between the acid anhydride groups and the amino groups. According to a further embodiment of the present invention, the polyamic acid has a structure of Formula 11 or 12:

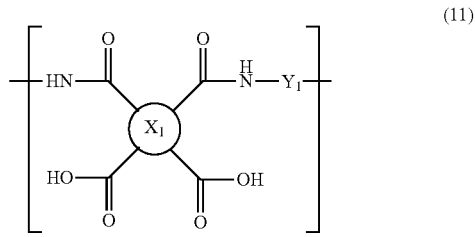
(11)

wherein $X_1$ and $Y_1$ are as defined above, or

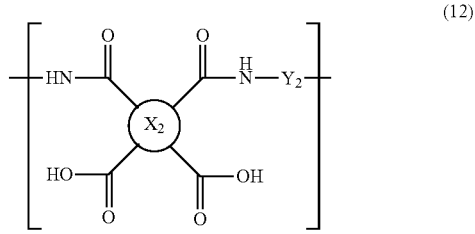

(12)

wherein $X_2$ and $Y_2$ are as defined above.

After the polymerization reaction, the resulting polyamic acid is imidized. Specifically, the imidization may be performed by chemical imidization or thermal imidization.

Specifically, the chemical imidization may be performed using a dehydrating agent. The dehydrating agent may be, for example, an acid anhydride, such as acetic anhydride, propionic anhydride or benzoic anhydride, or its acid chloride, or a carbodiimide compound, such as dicyclohexyl carbodiimide. The dehydrating agent is preferably used in an amount of 0.1 to 10 moles per mole of the acid dianhydride.

The chemical imidization may also be effected in combination with heating at a temperature of 60 to 120° C.

The thermal imidization may be performed by heat treatment at a temperature of 80 to 400° C. As a result of dehydration, water is formed, which is more preferably removed by azeotropic distillation with benzene, toluene or xylene.

The chemical or thermal imidization process may be carried out in the presence of a base catalyst, such as pyridine, isoquinoline, trimethylamine, triethylamine, N,N-dimethylaminopyridine, imidazole, 1-methylpiperidine or 1-methylpiperazine. The base catalyst may be used in an amount of 0.1 to 5 moles per mole of the acid dianhydride.

During the imidization process, water is formed from H of the —CO—NH— group and OH of the —CO—OH group and leaves from the polyamic acid molecule, giving the polyimide of Formula 1 having a cyclic chemical structure (—CO—N—OO—).

The polyimide resin precursor composition may further include a thermal cross-linking agent, a curing accelerator, a phosphorus-based flame retardant, a defoaming agent, a leveling agent, an anti-gelling agent or a mixture thereof. Any suitable additive known in the art may be used without particular limitation in the polyimide resin precursor composition. The additive may be used in an appropriate amount taking into consideration the physical properties of the polyimide resin precursor composition or a film obtained therefrom.

According to one embodiment, the polyimide precursor composition may include silica-based particles. For example, the polyamic acid may be mixed and reacted with silica-based particles or may be reacted with a silane-based compound to prepare a polyamic acid polymer, which is then reacted with an alkoxysilane to prepare a composite including the polyamic acid polymer and the silica-based particles. Silica-based particles may also be chemically bonded to one or more substituents of $R_1$ to $R_8$ in Formula 1. The presence of silica-based particles can ensure improved mechanical properties and good thermal stability sufficient to prevent a substrate from warpage and can contribute to an improvement in chemical resistance.

A further aspect of the present invention provides a method for producing a polyimide film for a flexible board of a photoelectronic device, the method including preparing a precursor composition including 50% by weight or less of a polyimide precursor derived from a diamine or acid dianhydride including the structure of Formula 1, applying the polyimide precursor composition to one side of a substrate and curing the polyimide precursor composition to form a polyimide film, and separating the polyimide film from the support.

The reaction between the acid dianhydride and the diamine can give a polyamic acid, which can be imidized to provide a polyimide resin.

The polyimide precursor composition of the present invention may have a viscosity of 10,000 to 20,000 cP.

The substrate may be, for example, a glass substrate, a metal substrate, a plastic substrate or a composite material consisting of two or more thereof.

Examples of suitable plastic substrates include plastic films made of at least one polymer selected from polyethylene terephthalate, polyethylene naphthalate, polypropylene, polyethylene, cellulose triacetate, cellulose diacetate, poly(meth)acrylic acid alkyl esters, poly(meth)acrylic acid ester copolymers, polyvinyl chloride, polyvinyl alcohol, polycarbonate, polystyrene, cellophane, polyvinylidene chloride copolymers, polyamide, polyimide, vinyl chloride.vinyl acetate copolymers, polytetrafluoroethylene, and polytrifluoroethylene.

Preferably, the substrate has a thickness of 5 to 150 μm. Particularly preferred is a glass substrate that is highly stable against heat and chemicals during curing of the polyimide precursor and can be easily separated without damage to the polyimide film formed after curing, avoiding the need for further treatment with a release agent.

More specifically, after application of the polyimide-based solution, drying may be optionally further performed prior to curing to remove the solvent present in the polyimide-based solution.

The application may be performed by any suitable technique known in the art. Specifically, spraying, roll coating, spin coating, slit coating, extrusion coating, curtain coating, die coating, wire bar coating or knife coating may be used to apply the polyimide-based solution. The drying conditions may vary depending on the constituents of the polyimide resin precursor composition, the kind of the organic solvent, and the ratio of the contents of the constituents. Preferably, the drying is performed at 60 to 100° C. for 30 seconds to 15 minutes. Specifically, the drying may be performed at a temperature not higher than 140° C. or at a temperature of 80 to 140° C. If the drying temperature is lower than 80° C., a long time is required for drying. Meanwhile, if the drying temperature exceeds 140° C., imidization proceeds rapidly, which makes it difficult to obtain a uniform thickness of the polyimide-based film.

The curing may be performed by heat treatment at a temperature of 80 to 500° C. According to one embodiment, the polyimide precursor composition may be cured at a temperature of 400 to 500° C., preferably 450 to 500° C. The curing may also be performed by stepwise heat treatment at various temperatures within the temperature range defined above. The curing time is not especially limited and may be, for example, from 30 minutes to 6 hours.

The polyimide film obtained after drying and curing has a thickness of 5 to 95 μm, preferably 10 to 50 μm, more preferably 10 to 20 μm. If the film thickness is less than 5 μm, poor insulation properties of the film are caused. Meanwhile, if the film thickness exceeds 95 μm, the transmittance and resolution of the film may be unsatisfactory.

After curing, subsequent heat treatment may be optionally further performed to increase the imidization degree of the polyimide-based resin in the polyimide-based film, achieving the desired physical properties of the polyimide-based film.

The subsequent heat treatment is performed at a temperature of at least 200° C. or a temperature of 200 to 500° C. It is preferred to perform the heat treatment at 400 to 500° C. for 1 to 30 minutes. The subsequent heat treatment may be performed either only once or at least twice in a stepwise manner. Specifically, the heat treatment may performed by three heat treatment steps including primary heat treatment at 200 to 220° C., secondary heat treatment at 300 to 450° C., and tertiary heat treatment at 400 to 550° C.

By the method, a laminate is produced in which the polyimide film is formed on the substrate. The substrate of the laminate may be stressed at 60 MPa or less after heat treatment at 100 to 350° C. That is, a reduced stress may be applied to the substrate during high-temperature heat treatment due to a difference in coefficient of thermal expansion between the film and the substrate. This can prevent the substrate from warpage. Specifically, the polyimide film may have a coefficient of thermal expansion (CTE) of 30 to 200 ppm at 100 to 250° C. According to a further embodiment, the coefficient of thermal expansion may be 160 ppm or less. According to another embodiment, the coefficient of thermal expansion may be 100 ppm or less.

Thereafter, the polyimide-based film is peeled from the substrate by any suitable technique known in the art.

A board for a display or a solar cell may be produced by peeling the polyimide film formed on the support in accordance with any suitable technique known in the art.

The resulting polyimide film may have an average transmittance of at least 80% to light at a wavelength of 350 nm to 760 nm, a modulus of 4 GPa or less, a tensile stress of 150 MPa or less, and a coefficient of thermal expansion (CTE) of 30 ppm to 200 ppm at 100 to 250° C.

Due to its controlled coefficient of thermal expansion and modulus, the polyimide precursor composition of the present invention can prevent the substrate from warpage during high-temperature heat treatment. Therefore, the polyimide precursor composition of the present invention is particularly suitable for use in the production of a flexible board of an electronic device, such as an OLED, an LCD, an electronic paper or a solar cell.

Hereinafter, embodiments of the present invention will be explained in detail such that the invention can be easily carried out by a person having ordinary knowledge in the art. The invention may, however, be embodied in many different forms and should not be construed as being limited to the embodiments set forth herein.

Partition Coefficients

The partition coefficients (Log P values, 25° C.) of solvents used in the following examples were calculated using an ACD/Log P module of an ACD/Percepta platform available from ACD/Labs. The ACD/Log P module uses an algorithm based on quantitative structure-property relationship (QSPR) methodology using 2D molecular structures.

TABLE 1

| Solvent | DEF | DMF | DEAc | DMAc | NMP | NEP |
|---|---|---|---|---|---|---|
| LogP (25° C.) | 0.05 | −1.01 | 0.32 | −0.75 | −0.28 | 0.22 |
| Boiling point (° C.) | 176-177 | 152-154 | 182-186 | 165 | 202-204 | 97 |

The abbreviations in Table 1 are as follows.
DMAc: N,N-dimethylacetamide
DEAc: N,N-diethylacetamide
DEF: N,N-diethylformamide
DMF: N,N-dimethylformamide
NMP: N-methylpyrrolidone
NEP: N-ethylpyrrolidone

EXAMPLE 1

Precursor of Formula 2

0.061 mol of 2,2'-bis(trifluoromethyl)benzidine (TFMB) and 0.0068 mol of an amino modified organopolysiloxane (P_PDMS_V, molecular weight: 1070 Mw, Shin-Etsu Chemical) were dissolved in 150 g of DEF:toluene (vol/vol 7:3), and 0.068 mol of BPDA and 100 g of DEF as a solvent were added thereto. The mixture was stirred at 15° C. for 2 h and at 25° C. for 10 h. The reaction was allowed to proceed under anhydrous conditions. The solid content of the reaction solution was adjusted to 25 wt % by the addition of DEF such that the reaction solution had a viscosity of 5,000 cP. The solution was homogenized for 24 h to prepare a polyimide precursor solution.

The structure of the P_PDMS_V is represented by Formula 13:

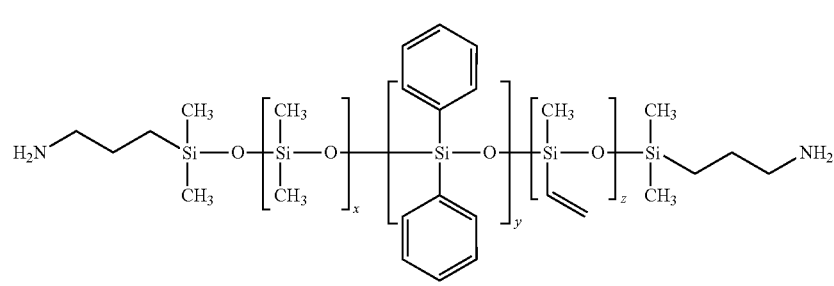

(13)

In Formula 13, x, y, and z representing the numbers of the repeating units and can improve the intramolecular flexibility, intermolecular compatibility, and chemical resistance of the P_PDMS_V, respectively. The repeating units may be arranged in any order. The repeating units may also be arranged alternately.

The molecular structure of the polyimide precursor is represented by Formula 14:

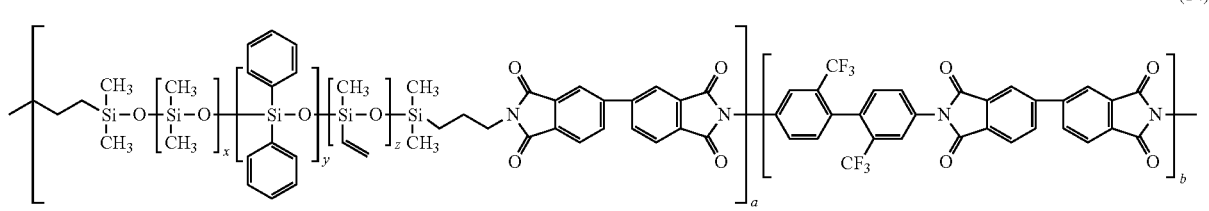

(14)

EXAMPLE 2

A precursor composition was prepared in the same manner as in Example 1, except that the content of the precursor of Formula 2 (P_PDMS_V) was 30 wt %.

EXAMPLE 3

A precursor composition was prepared in the same manner as in Example 1, except that the content of the precursor of Formula 2 (P_PDMS_V) was 50 wt %.

EXAMPLE 4

A precursor composition was prepared in the same manner as in Example 1, except that oxydiphthalic anhydride (ODPA) was used instead of BPDA and the content of the precursor of Formula 2 (P_PDMS_V) was 30 wt %.

COMPARATIVE EXAMPLE 1

Precursor of Formula 3 (BPDA-TFMB)

20 g of 3,3',4,4'-biphenyltetracarboxylic dianhydride was dissolved in 150 g of diethylformamide (DEF) under a nitrogen atmosphere for 20 min. To the resulting BPDA/DEF solution was added a solution of 32.6 g of 2,2'-bis (trifluoromethyl)benzidine (TFMB) as a diamine-based compound in 110 g of DEF (TFMB/DEF solution). The mixture was allowed to react at 25° C. for 2 h. After heating to 40° C., the reaction was continued for additional 24 h. The solid content of the reaction solution was adjusted to 10 wt % by the addition of DEF such that the reaction solution had a viscosity of 5,000 cP. The mixture was homogenized for 24 h to prepare a polyimide precursor solution.

COMPARATIVE EXAMPLE 2

A precursor composition was prepared in the same manner as in Comparative Example 1, except that oxydiphthalic anhydride (ODPA) was used instead of BPDA.

COMPARATIVE EXAMPLE 3

A precursor composition was prepared in the same manner as in Comparative Example 1, except that 2,2-bis[4-(4-aminophenoxy)phenyl]hexafluropropane (BAPP) was used instead of TFMB.

PRODUCTION EXAMPLE 1

Each of the polyimide precursor solutions was spin coated to a thickness of about 10 microns on a glass substrate. The glass substrate coated with the polyimide precursor solution was placed in an oven, heated at a rate of 3° C./min, and cured while maintaining at 80, 120, 180, and 250° C. (each for 30 min to 1 h).

TEST EXAMPLE 1

Glass stresses were expressed as Bow values and were measured as follows.

Glass having a size of 10 cm×10 cm was mounted on a stress measurement system (FLX2320, TENCOR). After the center of the glass was scanned with a laser, a deviation in the degree (height) of warpage of the glass between the left and right positions distant 4 cm from the center (over a total length of 8 cm) excluding 1 cm from each edge was measured.

TEST EXAMPLE 2

The maximum elongations, moduli, maximum stresses, and coefficients of thermal expansion of the polyimide films produced in Production Example 1 were measured.

The yellowness Index (YI) of each film was measured using a colorimeter (Color Eye 7000A)

The coefficient of thermal expansion (CTE) of each film was measured using a thermomechanical analyzer (Q400, TA).

The film was cut to a size of 5×20 mm and the sample was loaded using an accessory. The length of the film for measurement was set to 16 mm. The force to pull the film was set to 0.02 N and the film was heated at a rate of 5° C./min from 30° C. to 350° C. The coefficient of linear thermal expansion of the film in the 1st cooling was measured.

The mechanical properties (modulus, maximum stress, and maximum elongation) of the film were measured using a Zwick universal testing machine (UTM). After the film was cut to a size of ≥5 mm (w)×60 mm (l), the distance between the grips was set to 40 mm and the values were measured while pulling the sample at a rate of 20 mm/min.

TEST EXAMPLE 3

Chemical Resistance (C.R) Test

Film curing conditions: 250° C. multi-step
◦: No film deformation, Δ: Partial film deformation, x: Film deformation

TEST EXAMPLE 4

Thickness Retardation (Rth, nm)

The thickness retardation (Rth) of the film was measured using Axoscan. First, the film was cut to a predetermined size and its thickness was measured. The retardation was measured using Axoscan and the measured thickness was input while calibrating in the C-plate direction to compensate for the retardation value.

Figure 2:
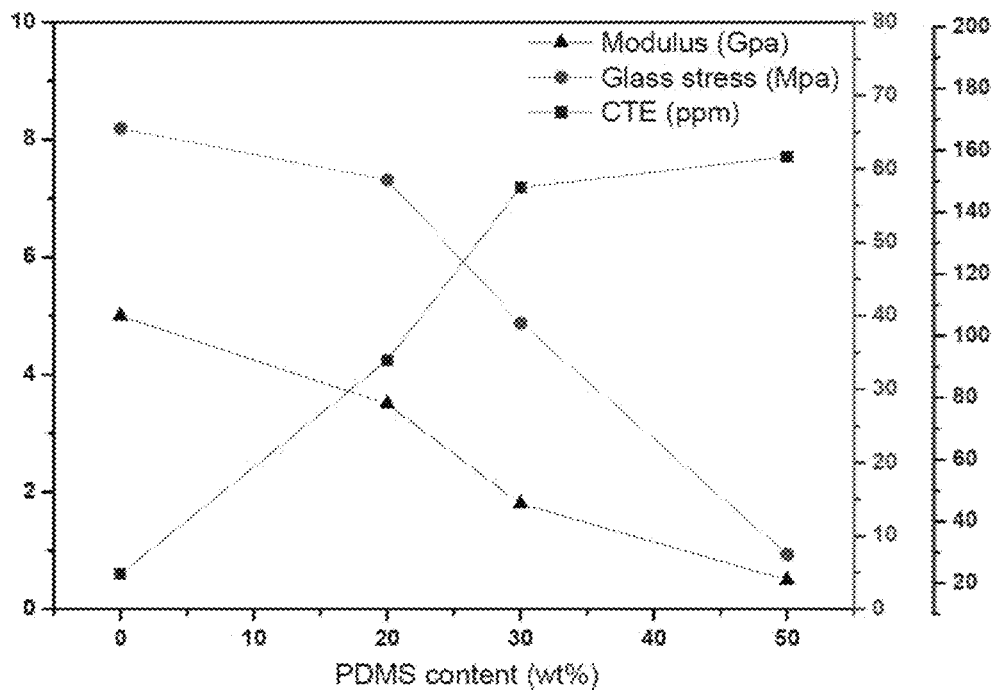
FIG. 2 is a graph showing the coefficients of thermal expansion, moduli, and glass stresses of polyimide films produced in Examples 1-3 and Comparative Example 1.

The test results are summarized in Tables 2 and 3 and FIG. 2.

TABLE 2

| | Example No. | | | |
|---|---|---|---|---|
| | Comparative Example 1 | Example 1 | Example 2 | Example 3 |
| Thickness (μm) | 11.2 | 11.5 | 10.8 | 10.3 |
| YI | 5 | 4 | 3.3 | 2.4 |
| CTE (ppm/K)/250-100° C. | 23 | 92 | 148 | 158 |
| Modulus (GPa) | 5.0 | 3.5 | 1.8 | 0.5 |
| Maximum tensile strength (MPa) | 200 | 105 | 40 | 20 |
| Maximum elongation (%) | 25 | 30 | 12 | 70 |
| Glass stress (Bow), μm | 66 | 55 | 39 | 7.5 |
| C.R. test Stripper | ○ | ○ | ○ | ○ |
| C.R. test Developer | ○ | ○ | ○ | ○ |

TABLE 3

| Example No. | Thickness (μm) | Maximum tensile strength (MPa) | C.R. test (r.t. 30 min) Stripper | C.R. test (r.t. 30 min) Developer | Modulus (GPa) | Rth, nm |
|---|---|---|---|---|---|---|
| Comparative Example 2 | 11.3 | 82.6 | ○ | ○ | 4.1 | 225 |
| Example 4 | 11.2 | 43.8 | ○ | ○ | 2.2 | 40 |
| Comparative Example 3 | 16.0 | 63.1 | — | — | 2.3 | 15 |

As shown in Table 2 and FIG. 1, the polyimide films produced using the polyimide compositions of Examples 1-3 had coefficients of thermal expansions of 30-200 and moduli of <4 GPa. In addition, significantly low stresses were applied to the glass substrates on which the polyimide films produced using the polyimide compositions of Examples 1-3 were formed than to the glass substrate on which the polyimide film produced using the polyimide composition of Comparative Example 1 was formed. The polyimide films produced using the polyimide compositions of Examples 1-3 were also excellent in other physical properties, including transparency and isotropicity. As can be seen from the results in Table 3, the polyimide film produced using the polyimide composition of Comparative Example 3 had a low modulus due to the presence of soft segments. However, a higher stress was applied to the glass substrate on which the polyimide film produced using the polyimide composition of Comparative Example 3 than to the glass substrate on which the polyimide film produced using the polyimide composition of Example 4.

While specific embodiments of the invention have been described in detail, it will be appreciated by those skilled in the art that such detailed descriptions are merely preferred embodiments and the scope of the present invention is not limited thereto. Therefore, the true scope of the present invention should be defined by the appended claims and their equivalents.

What is claimed is:

1. A polyimide film for a flexible board of a photoelectronic device comprising: a cured product of a polyimide precursor composition comprising:

a polyimide precursor derived from a diamine or acid dianhydride comprising a structure of Formula 1:

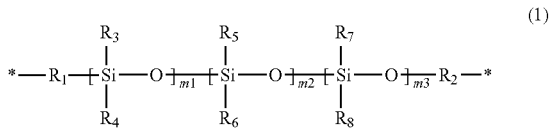

(1)

$$*-R_1 \!\!-\!\!\left[\!\!Si\!\!\begin{array}{c}R_3\\|\\|\\R_4\end{array}\!\!-\!\!O\right]_{m1}\!\!\left[\!\!Si\!\!\begin{array}{c}R_5\\|\\|\\R_6\end{array}\!\!-\!\!O\right]_{m2}\!\!\left[\!\!Si\!\!\begin{array}{c}R_7\\|\\|\\R_8\end{array}\!\!-\!\!O\right]_{m3}\!\!R_2-*$$

wherein $R_1$ and $R_2$ are each independently a single bond, a $C_1$-$C_5$ alkylene group or a divalent aromatic group comprising six or more carbon atoms, $R_3$ and $R_4$ are each independently a $C_1$-$C_5$ alkyl group, $R_5$ and $R_6$ are each independently a $C_4$-$C_{10}$ aryl group, $R_7$ and $R_8$ are a $C_1$-$C_5$ alkyl group or a $C_2$-$C_{10}$ alkenyl group provided that at least one of $R_7$ and $R_8$ is a $C_2$-$C_{10}$ alkenyl group, and m1, m2, and m3 are each independently an integer equal to or greater than 1; and a solvent having a positive partition coefficient and comprising a first solvent and a second solvent, wherein the first solvent is an amine based solvent and the second solvent is a non-amine-based solvent, and wherein the film has a modulus of 4 GPa or less, a tensile stress of 150 MPa or less, and a coefficient of thermal expansion (CTE) of 30 ppm to 200 ppm at 100 to 250° C., and wherein the film has an average transmittance of at least 80% to light at a wavelength of 350 nm to 760 nm.

2. The polyimide film according to claim 1, wherein the polyimide precursor composition comprises 50% by weight or less of the diamine- or acid dianhydride-derived polyimide precursor, based on the total weight of the composition.

3. The polyimide film according to claim 1, wherein the diamine- or acid dianhydride-derived polyimide precursor has a molecular weight of 600 to 7,000.

4. The polyimide film according to claim 1, wherein m1, m2, and m3 in Formula 1 are each independently an integer from 1 to 10.

5. The polyimide film according to claim 1, wherein the amine-based solvent and the non-amine-based solvent are present in a volume ratio of 50-90:10-50.

6. The polyimide film according to claim 1, wherein the amine-based solvent is a tertiary amine substituted with an alkyl group comprising two or more carbon atoms.

7. The polyimide film according to claim 1, wherein the non-amine-based solvent is toluene or tetrahydrofuran.

8. The polyimide film according to claim 1, further comprising silica-based particles.

9. The polyimide film for a flexible board of a photoelectronic device according to claim 1, wherein the film is disposed on a glass substrate.

10. A photoelectronic device comprising the polyimide film according to claim 9 as a flexible board.

11. A flexible display comprising the polyimide film according to claim 9 as a flexible board.

12. A laminate comprising a glass substrate and a polyimide film formed on the glass substrate wherein the laminate is obtained by applying the film according to claim 1 to the glass substrate.

13. The laminate according to claim 12, wherein the substrate of the laminate is stressed at 60 MPa or less after heat treatment at 100 to 350° C.

14. The polyimide film according to claim 1, wherein the amine-based solvent has a positive partition coefficient.

15. The polyimide film according to claim 1, wherein the amine-based solvent is selected from N,N-diethylacetamide, N,N-diethylformamide, N-ethylpyrrolidone, and mixtures thereof.

\* \* \* \* \*